United States Patent
Li et al.

(10) Patent No.: US 7,057,939 B2
(45) Date of Patent: Jun. 6, 2006

(54) NON-VOLATILE MEMORY AND CONTROL WITH IMPROVED PARTIAL PAGE PROGRAM CAPABILITY

(75) Inventors: Yan Li, Milpitas, CA (US); Yupin Kawing Fong, Fremont, CA (US); Toru Miwa, Kanagawa (JP)

(73) Assignee: SanDisk Corporation, Sunnyvale, CA (US)

( * ) Notice: Subject to any disclaimer, the term of this patent is extended or adjusted under 35 U.S.C. 154(b) by 17 days.

(21) Appl. No.: 10/830,824

(22) Filed: Apr. 23, 2004

(65) Prior Publication Data

US 2005/0237814 A1    Oct. 27, 2005

(51) Int. Cl.
*G11C 16/04* (2006.01)

(52) U.S. Cl. .......................... 365/185.28; 365/185.18; 365/185.03

(58) Field of Classification Search ........... 365/185.28, 365/185.18, 185.03
See application file for complete search history.

(56) References Cited

U.S. PATENT DOCUMENTS

| | | | |
|---|---|---|---|
| 4,357,685 A | 11/1982 | Daniele et al. | |
| 5,070,032 A | 12/1991 | Yuan et al. | |
| 5,095,344 A | 3/1992 | Harari | |
| 5,172,338 A | 12/1992 | Mehrotra et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,418,752 A | 5/1995 | Harari et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,774,397 A | 6/1998 | Endoh et al. | |
| 5,867,429 A | 2/1999 | Chen et al. | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,288,935 B1 | 9/2001 | Shibata et al. | |
| 6,522,580 B1 | 2/2003 | Chen et al. | |
| 6,657,891 B1 | 12/2003 | Shibata et al. | |
| 6,760,257 B1 * | 7/2004 | Huang et al. ........... | 365/185.18 |
| 6,768,681 B1 * | 7/2004 | Kim ....................... | 365/185.28 |
| 6,781,877 B1 | 8/2004 | Cernea et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Huan Hoang
(74) *Attorney, Agent, or Firm*—Parsons Hsue & De Runtz LLP

(57) ABSTRACT

In a non-volatile memory programming scheme where the memory cells are programmed in two or more sequential programming passes, when there is insufficient host data to program at least some of the memory cells during the second pass, some of the memory cells may be programmed to the wrong threshold voltage. This can be prevented by modifying the programming scheme so that this does not occur. In one implementation, this is accomplished by choosing a code scheme, which does not cause the memory cells to be programmed to the wrong threshold voltage during the second programming pass, or by programming the memory cells in accordance with substitute data that would not cause the cells to be programmed to an erroneous state.

25 Claims, 12 Drawing Sheets

U.S. PATENT DOCUMENTS

| | | | | |
|---|---|---|---|---|
| 6,845,039 B1 * | 1/2005 | Chen et al. | ............ | 365/185.03 |
| 2004/0047183 A1 | 3/2004 | Tanaka et al. | | |
| 2004/0060031 A1 | 3/2004 | Cernea | | |

OTHER PUBLICATIONS

Notification of Transmittal of the International Search Report and the Written Opinion of the International Searching Authority, or the Declaration, in corresponding PCT/US2005/013018, dated Apr. 8, 2005, 12 pp.

Takeuchi et al., "A Multi-Page Cell Architecture for High-Speed Programming Multi-Level NAND Flash Memories," 1997 Symposium on VLSI Circuits Digest of Technical Papers, Jun., 1997, pp. 67-68.

* cited by examiner

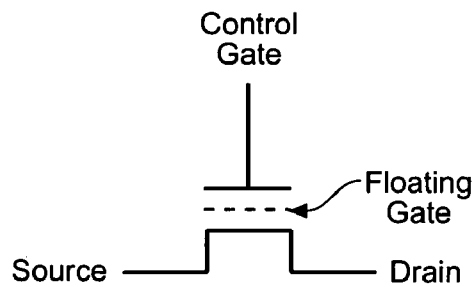
FIG._1A
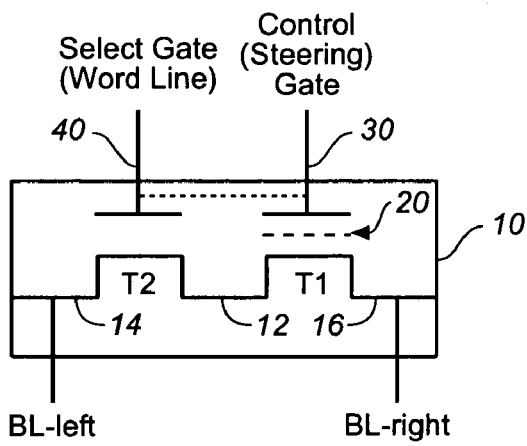
FIG._1B
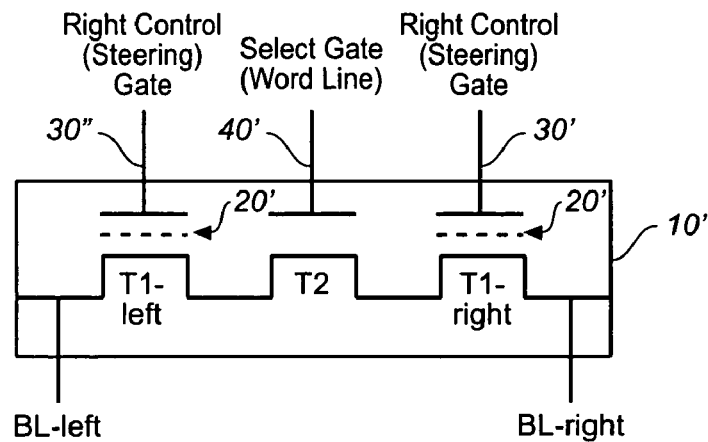
FIG._1C

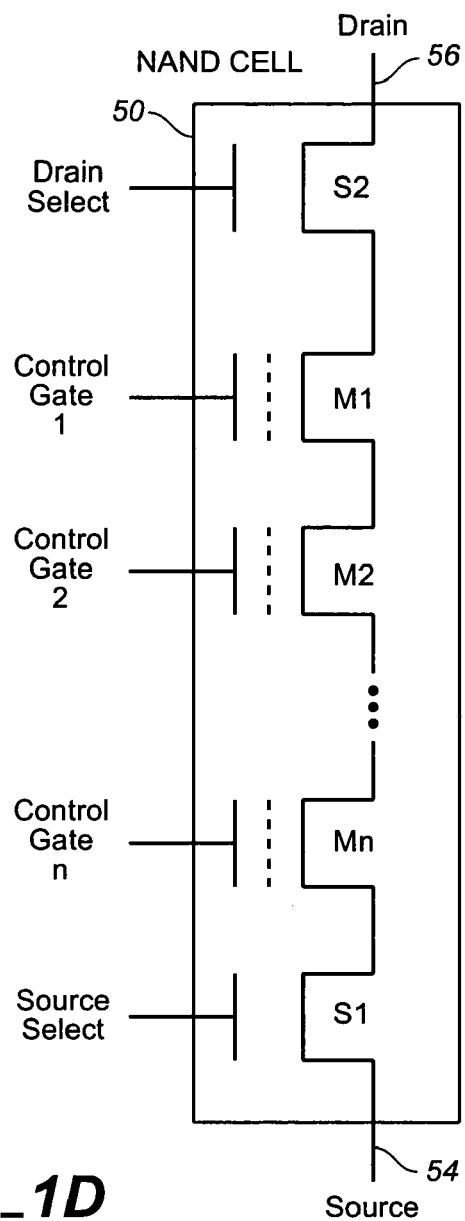
FIG._1D
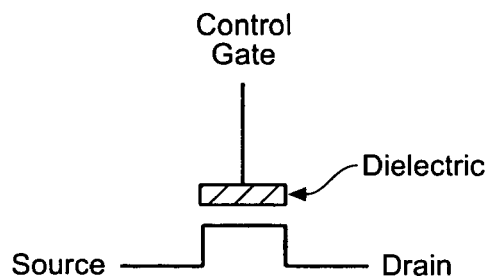
FIG._1E

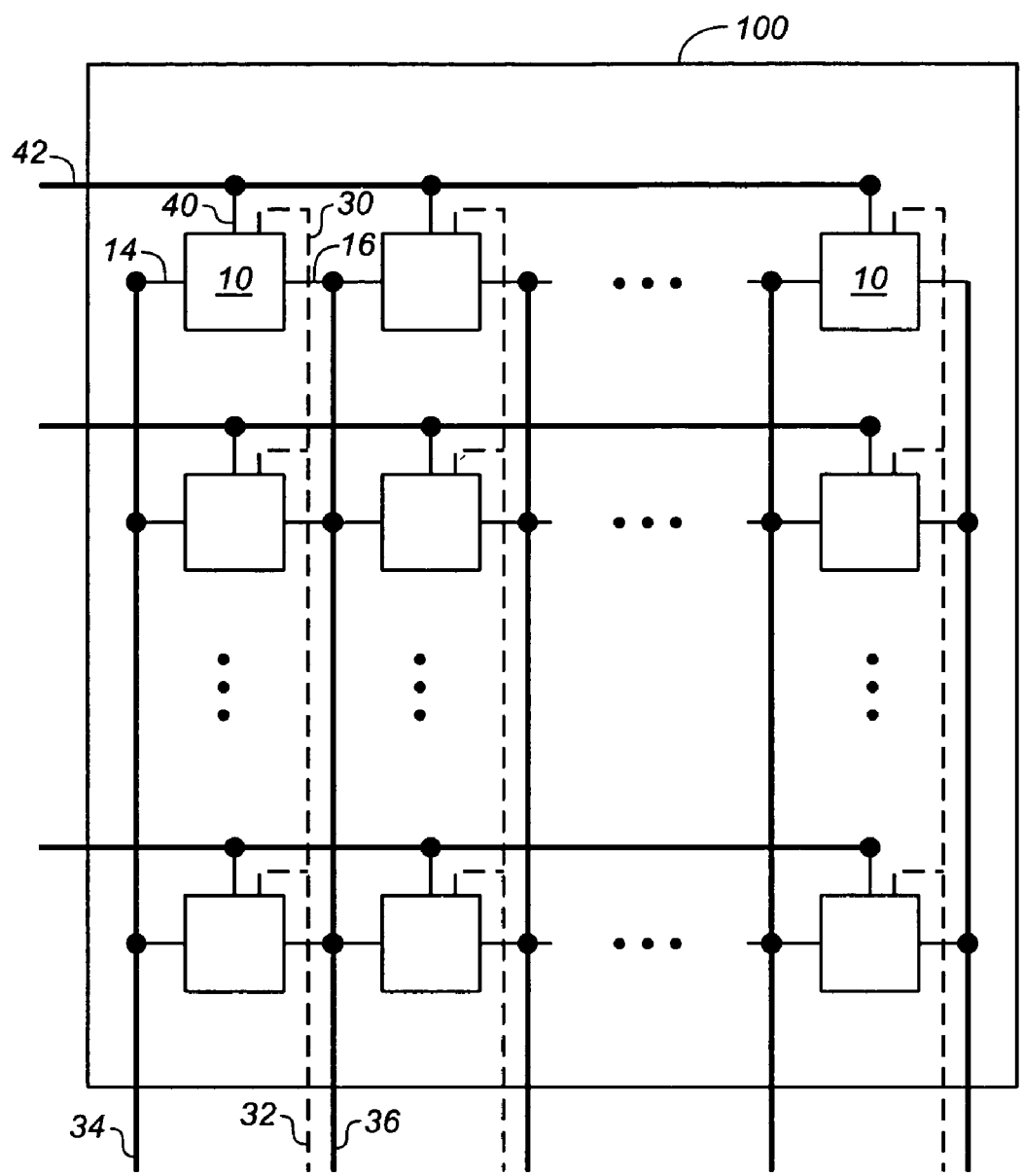
FIG._2

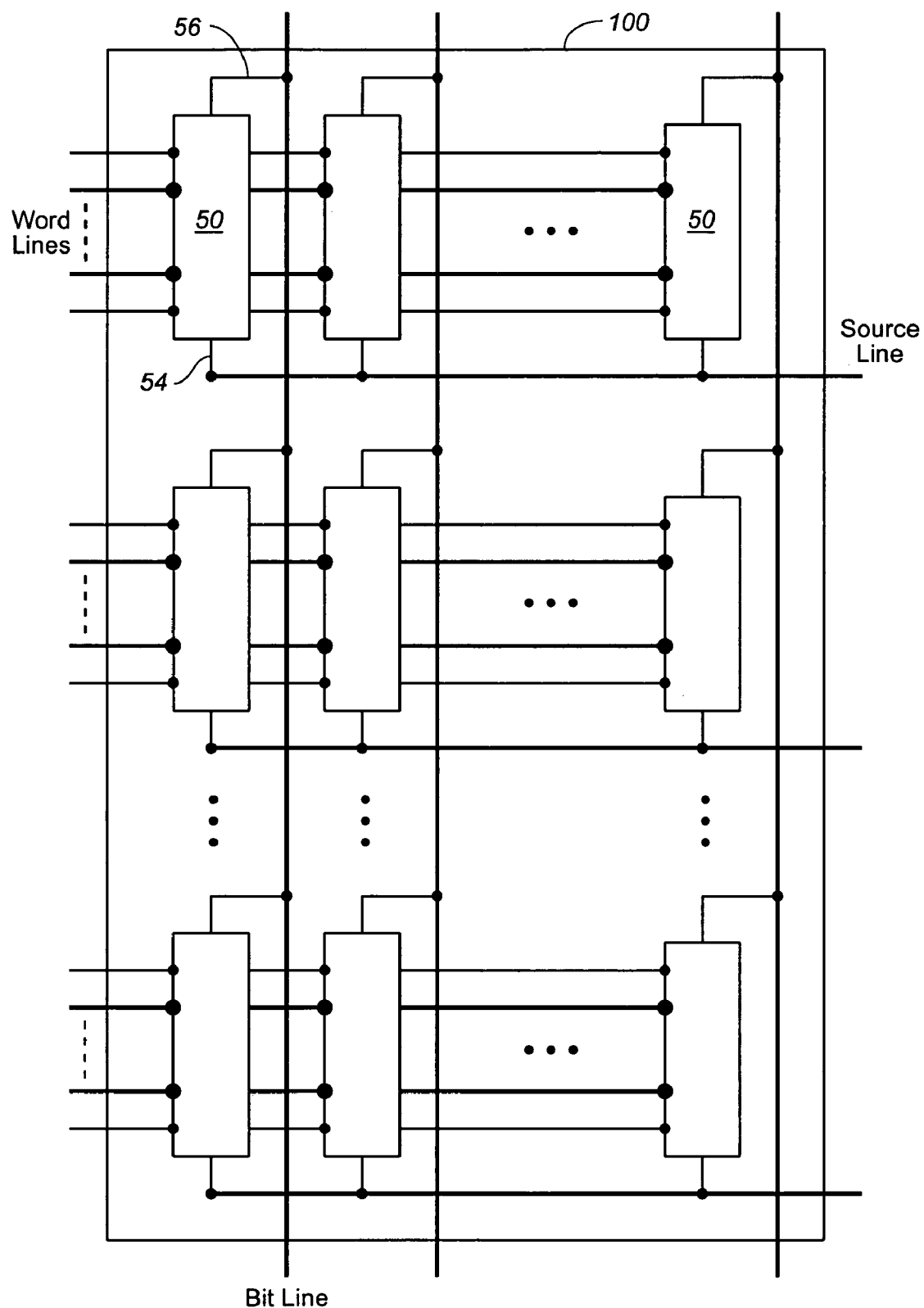
FIG._3

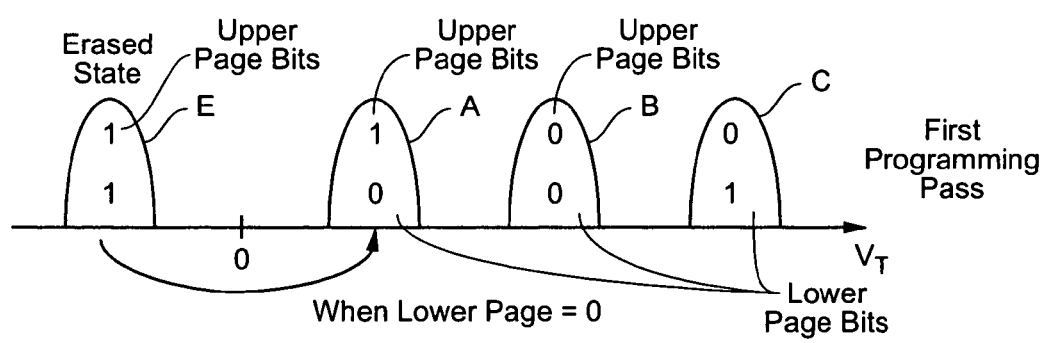
FIG._4A
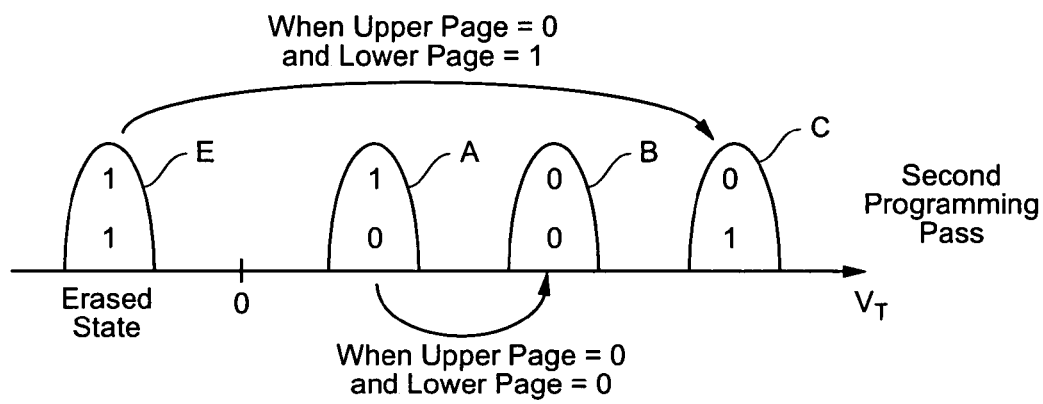
FIG._4B

After Writing the First Page and Before Writing the Second Page
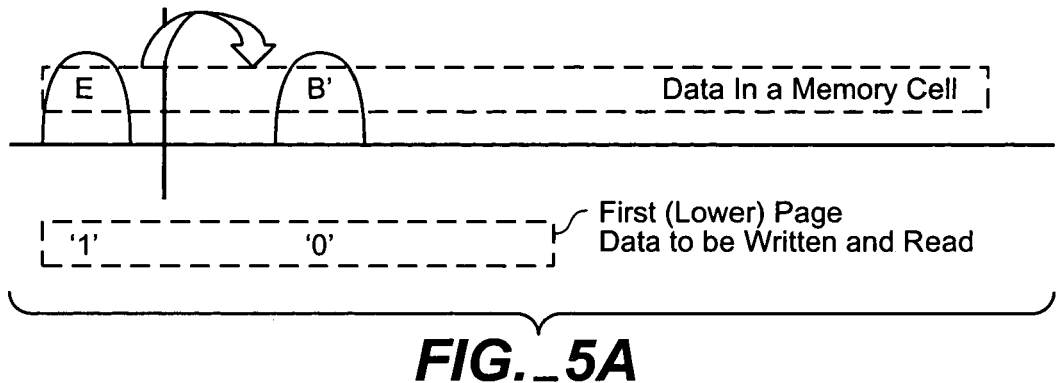
FIG._5A
Before Writing the Second (Upper) Page and After Writing the Adjacent Cells
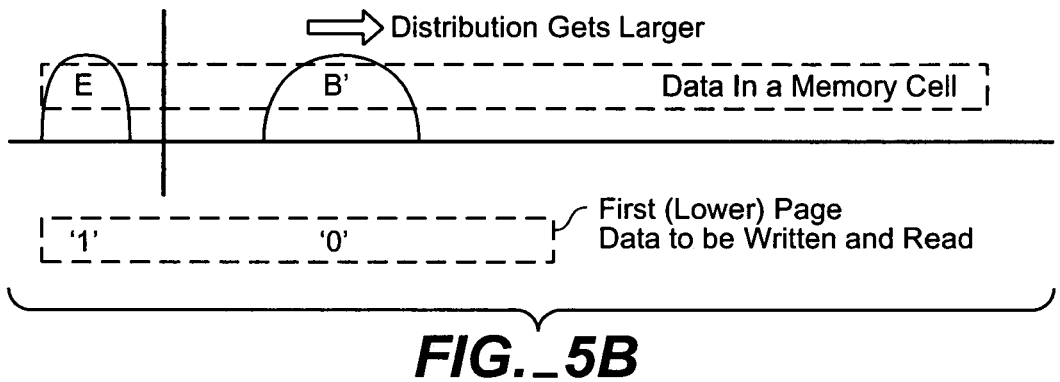
FIG._5B
After Writing the Second Page
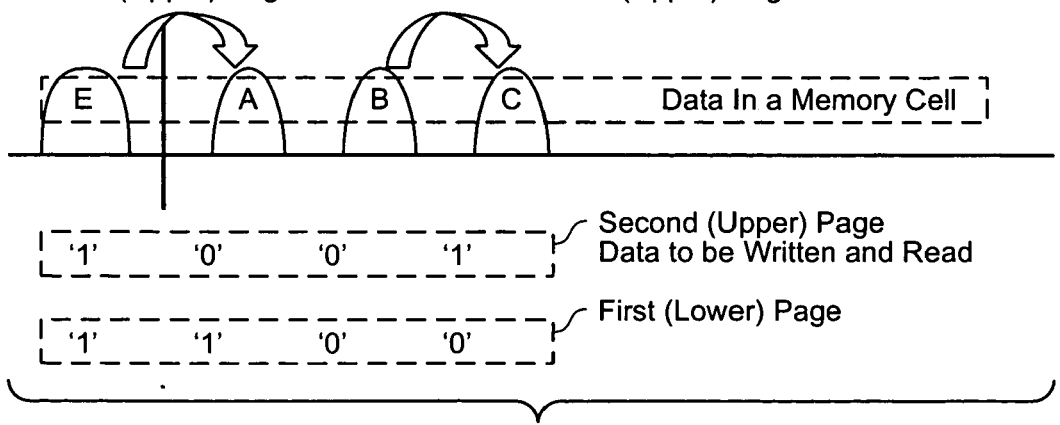
FIG._5C

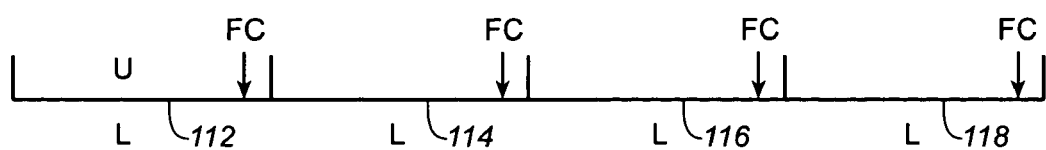
FIG._6A
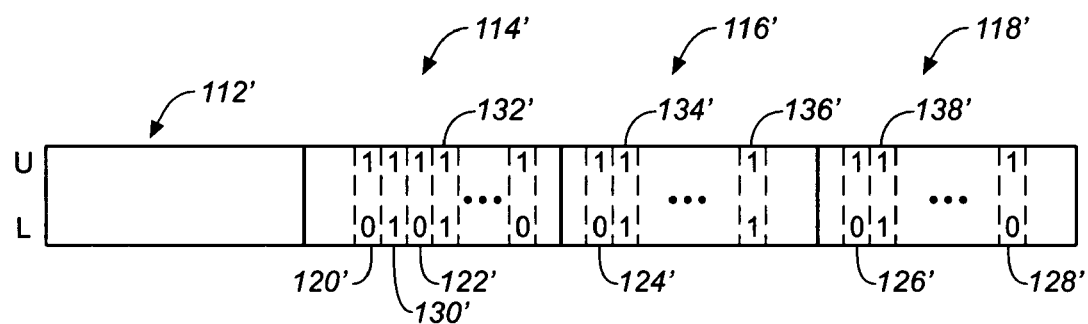
FIG._6B

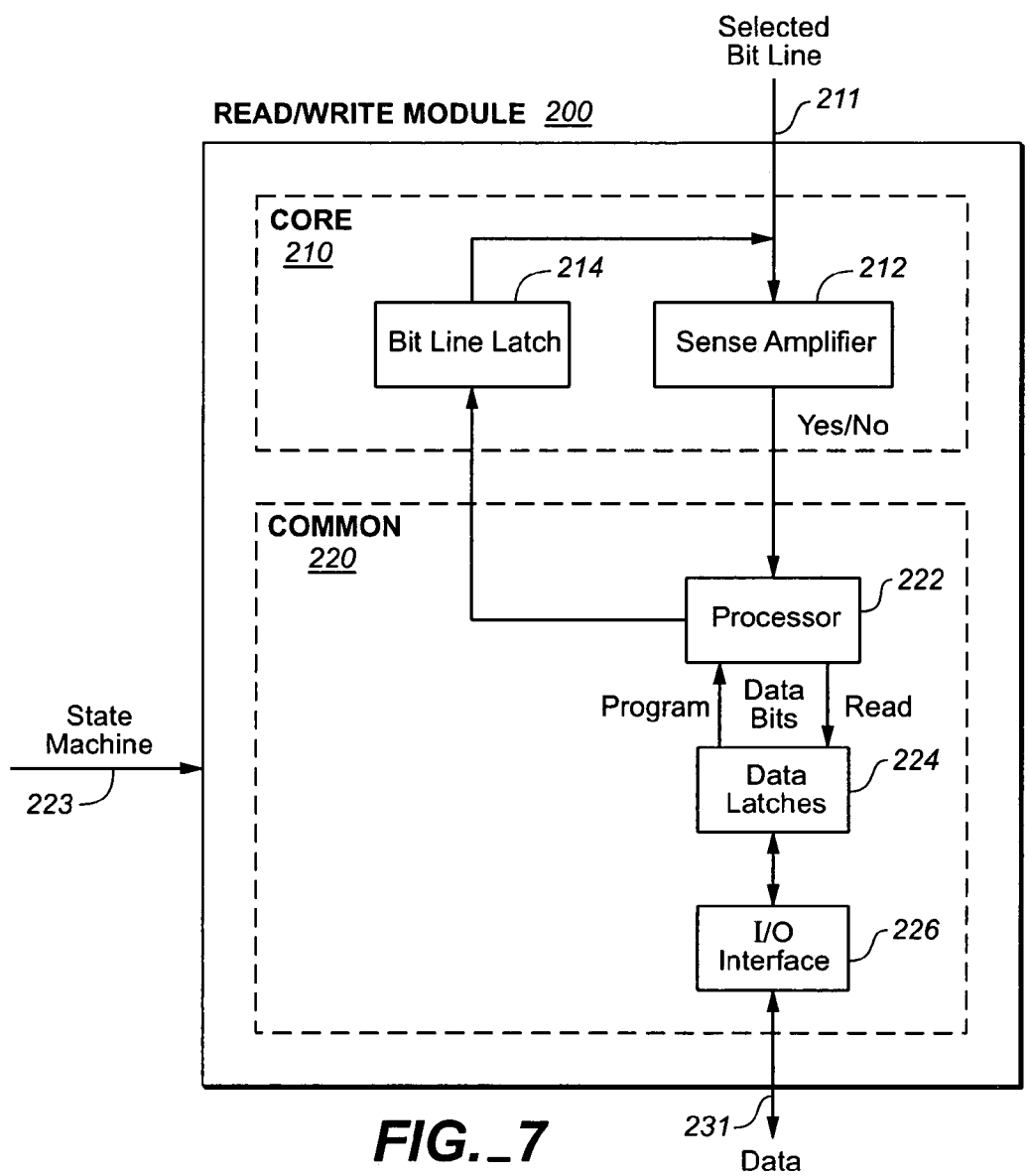
FIG._7

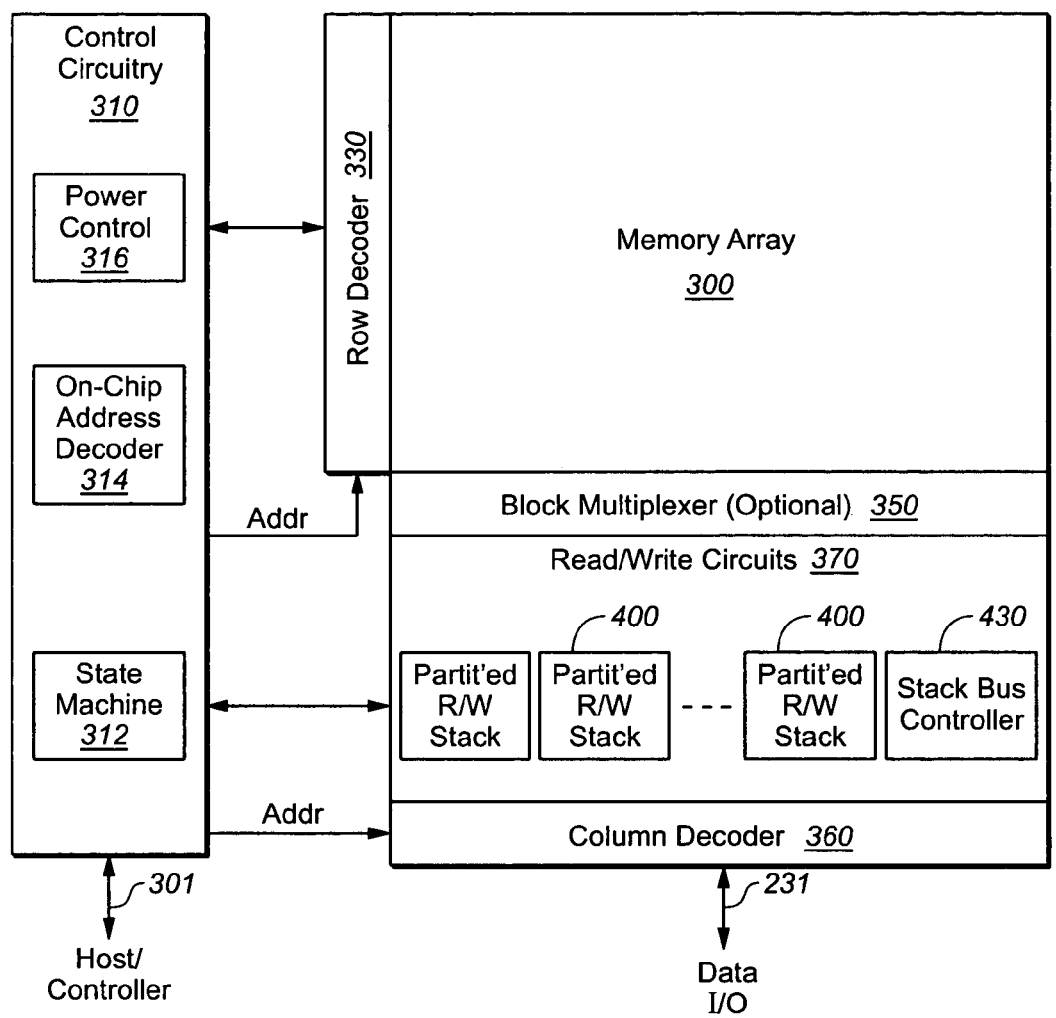
FIG._8A

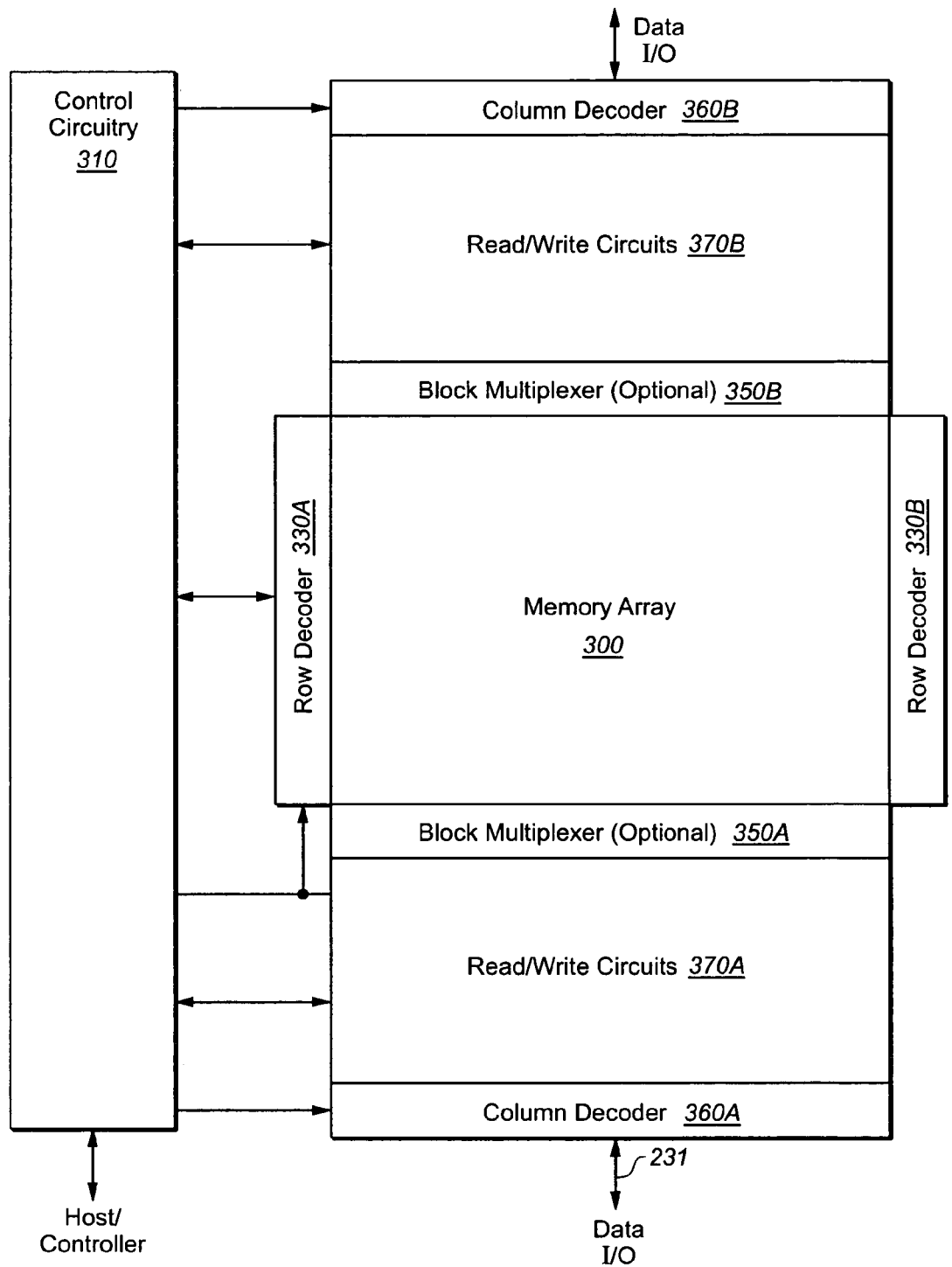
FIG._8B

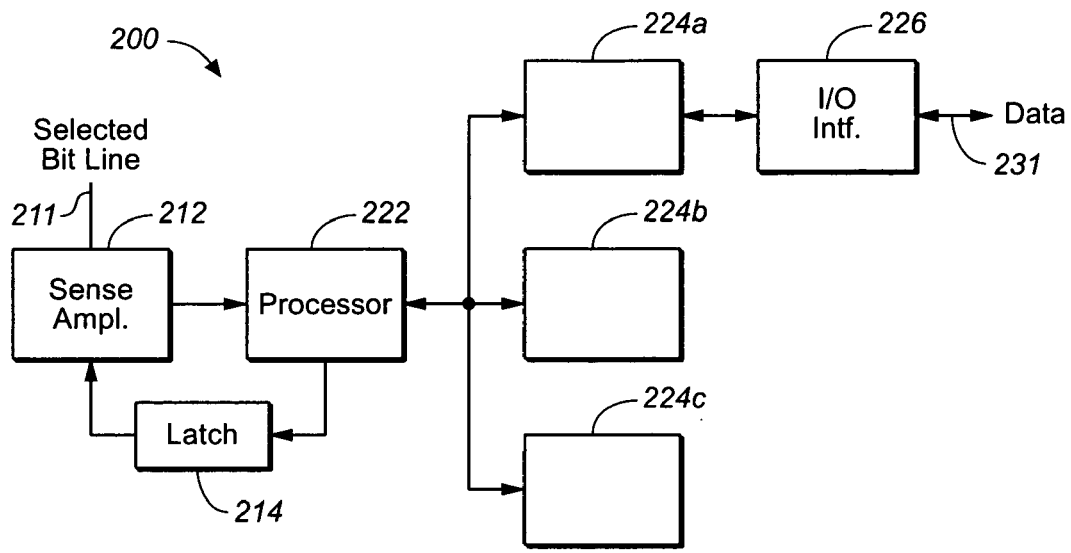
FIG._9
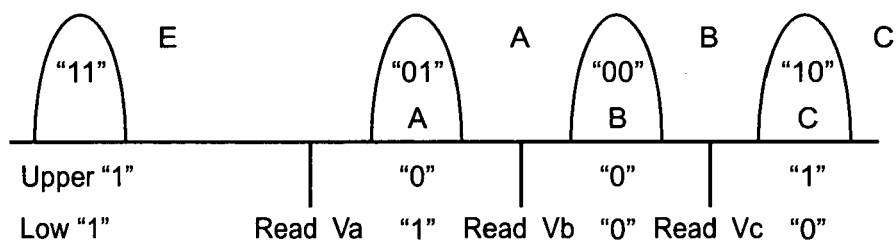
FIG._10A
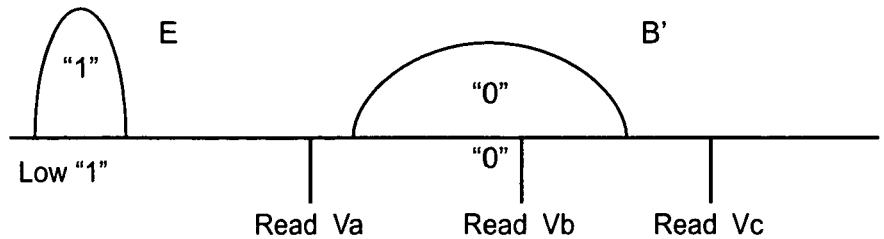
FIG._10B

Upper Page Read:
| Sector 112': | E | A | B | C |
|---|---|---|---|---|
| Read Va | 1 | 0 | 0 | 0 |
| Read Vc | 0 | 0 | 0 | 1 |
| Combine | 1 | 0 | 0 | 1 |
| Sectors 114', 116', 118': | E | B' | | |
| Read Va | 1 | 0 | | |
| Read Vc | 0 | 0 | | |
| Combine | 1 | 0 | | |
*FIG._11A*
Lower Page Read:
From ReadB Data, We Will Get LM Flag.
| Sector 112':<br>Flag = 0 | E | A | B | C |
|---|---|---|---|---|
| i) Read Vb | 1 | 1 | 0 | 0 |
| ii) Read Va (not needed) | 1 | 0 | 0 | 0 |
| Read out from i) | 1 | 1 | 0 | 0 |
| Sectors 114', 116', 118':<br>Flag = 1 | E | B' | | |
| i) Read Vb | 1 | 0/1 mix | | |
| ii) Read Va | 1 | 0 | | |
| Read out from ii) | 1 | 0 | | |
*FIG._11B*
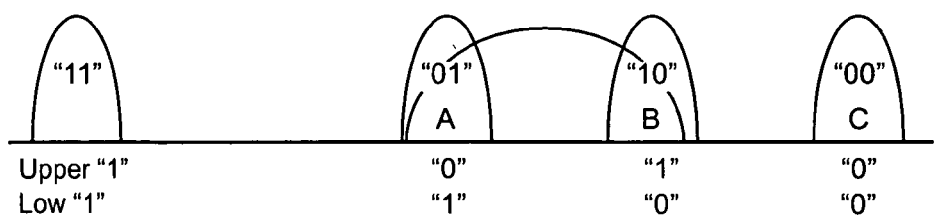
*FIG._12*

NON-VOLATILE MEMORY AND CONTROL WITH IMPROVED PARTIAL PAGE PROGRAM CAPABILITY

BACKGROUND OF THE INVENTION

This invention relates generally to non-volatile semiconductor memories such as electrically erasable programmable read-only memory (EEPROM) and flash EEPROM, and specifically ones with improved partial page program capability.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Flash memory, both embedded and in the form of a removable card is ideally suited in the mobile and handheld environment because of its small size, low power consumption, high speed and high reliability features.

EEPROM utilizes a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A–1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line running perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into a NAND cell. A NAND cell 50 consists of a series of memory transistors M1, M2, ... Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within a NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effectively created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903,495, 6,046,935.

FIG. 1E illustrates schematically a non-volatile memory with a dielectric layer for storing charge. Instead of the conductive floating gate elements described above, separate regions of the dielectric layer are used as the charge storage element. Such memory devices utilizing dielectric storage element have been described by Eitan et al., "NOM: A Novel Localized Trapping, 2-Bit Nonvolatile Memory Cell," IEEE Electron Device Letters, vol. 21, no. 11, November 2000, pp. 543–545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically contains a two-dimensional array of memory cells arranged in rows and columns and addressable by word lines and bit lines. The array can be formed according to an NOR type or a NAND type architecture.

NOR Array

FIG. 2 illustrates an example of an NOR array of memory cells. Memory devices with an NOR type architecture have been implemented with cells of the type illustrated in FIGS. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performs two functions: row selection and supplying control gate voltage to all cells in the row for reading or programming.

NAND Array

FIG. 3 illustrates an example of a NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of a NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase units. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

Read/Write Circuits

In the usual two-state EEPROM cell, at least one breakpoint level is established so as to partition the conduction window into two regions. The state of the cell relative to the breakpoint is commonly determined using either "current" sense or "voltage" sense. Using current sense, a cell is read by applying predetermined, fixed voltages, its gate, source, and drain and the resulting current is compared to either an absolute value or to a value obtained from a similar cell whose threshold has been deliberately set to a mid value between the two extreme states. If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a read level is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window (current sense), it is possible to set the threshold voltage for a given memory state under test at the control gate and detect if the conduction current is lower or higher than a threshold current (voltage sense). In one implementation the detection of the conduction current relative to a threshold current is accomplished by examining the rate the conduction current is discharging through the capacitance of the bit line; if the cell is programmed (a higher threshold relative to the gate voltage) the discharge current will be so small that the relatively large capacitance of the bit line will not be significantly discharged and the sense amplifier will return a "0" state.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

Memory array 100 is accessible by read/write circuits via a row decoder and a column decoder. As shown in FIGS. 2 and 3, a memory transistor of a memory cell in the memory array 100 is addressable via a set of selected word line(s) and bit line(s). The row decoder selects one or more word lines and the column decoder selects one or more bit lines in order to apply appropriate voltages to the respective gates of the addressed memory transistor. Read/write circuits are provided to read or write (program) the memory states of addressed memory transistors. The read/write circuits comprise a number of read/write modules connectable via bit lines to memory elements in the array.

During read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits can be arranged into various architectures.

A highly compact and high performance non-volatile memory and method of control are described in U.S. patent application entitled "Highly Compact Non-Volatile Memory and Method Thereof," Ser. No. 10/254,483, filed Sep. 24, 2002 by Raul-Adrian Cernea, which is incorporated herein by reference in its entirety.

FIGS. 4A and 4B illustrate the specific existing technique of programming a 4-state NAND memory cell in an array of the type described above. These two figures and the accompanying description of the programming process are taken from U.S. Pat. No. 6,522,580, which is incorporated herein by reference in its entirety.

FIGS. 4A and 4B show threshold voltage distributions for a 4-states NAND memory cell in an array of the type described above, where the floating gate of the cell in the array stores two bits of data, namely four data states, in each cell. The curve E represents a distribution of the threshold levels $V_T$ of the cell within the array that are in the erased state ("11" data state), being negative threshold voltage levels. In the event that the cells are set to states other than the above-described erased state as the initial state of the cells before programming of the cells, the curve E as used in this application also represents such states; more generally, all such states including the erased state are referred to herein as "reset states," Threshold voltage distributions A and B of the storage elements storing "10" and "00" user data respectively, are shown to be between 0 volts and 1 volt and between 1 volt and 2 volts respectively. The curve C shows the distribution of memory cells that have been programmed to the "01" data states, being the highest threshold voltage levels more than 2 volts and less then 4.5 volts of the read past voltage. The terms "user data" and "host data" are used interchangeably herein.

Each of the two bits stored in a single memory cell is from a different logical page and may be programmed at different times. Each of the two bits carries a different logical page address from each other. The two bits stored in a single memory cell form an ordered set or pair of variables of binary values (a more significant bit and a less significant bit). The less significant bit in the user or host data "11", "10", "00" and "01" is accessed when the lower page address is input. The more significant bit of the user or host data is accessed when an upper page address is input. Where the data stored comprises more than two bits, the ordered set of stored values may include more than two variables. The logical page designation is different from the designation of even and odd or interleaved pages, which relate to the physical configuration of the memory cells in the memory array. The designating of logical pages can also be extended to where the threshold window is divided into finer divisions to allow for more than 4 states to be stored in the cells to represent more than two data bits per cell, so that more than two pages are used, in which case they may simply be referred to numerically, such as the first, second, third pages etc.

As noted above, prior to a program operation, one or more blocks of memory cells (also called charge storage elements herein) are electrically erased together, to the erased state "11." Then the user or host data in the data buffer is then used to set the charge storage level or threshold level of the charge storage elements. In the first programming pass, the cell's threshold level is set according to the bits from the lower logical page in the data buffer. If that bit is a "1," nothing is done since the cell is in an erased state as a result of having been earlier erased. However, if that bit is a "0," the level of the cell is increased to the first programmed state A. That concludes the first programming pass.

In a second programming pass, the cell's threshold level is set according to the bit being stored in the data buffer from the upper logical page. If a "1," no programming occurs since the cell is in one of the states E or A, depending upon the programming of the lower page bit, both of which carry an upper page bit of "1." If the upper page bit is a "0," however, the cell is programmed a second time. If the first pass resulted in the cell remaining in the erased state E, the cell is programmed from that state to the highest state C, as shown by the upper arrow in FIG. 4B. If the cell has been programmed into the state A, however, as a result of the first programming pass, the cell is further programmed in the second pass from that state to the state B, as shown by the lower arrow of FIG. 4B. The result of the second pass is to program the cell into the states designated to store a "0" from the upper page without changing the result of the first pass programming of the lower page bit.

During the second programming pass, where the upper page bit is a "0," the cell should be programmed from either the erased state E to the highest state C or from the state A to the state B, in accordance with the upper and lower arrows in FIG. 4B. In order to determine whether the programming should occur in accordance with the upper or lower arrow, it is necessary to first determine whether the cell is in state E or A. In some devices, this is performed by a process known as internal read or internal data load, where a cell that has been programmed during a first programming pass is read to determine whether its threshold level corresponds to state E or A.

Field-effect coupling between adjacent floating gates of cells in the memory array of the type described above is described in U.S. Pat. No. 5,867,429 of Jian Chen and Yupin Fong, which patent is incorporated herein in its entirety by this reference. The degree of this coupling is necessarily increasing as the sizes of memory cell arrays are being decreased as the result of improvements of integrated circuit manufacturing techniques. The problem occurs most pronouncedly between two sets of adjacent cells that have been programmed at different times. One set of cells is programmed to add a level of charge to the floating gates that corresponds to one set of data. After the second set of cells is programmed with the second set of data, the charge levels read from the floating gates of the first set of cells often appear to be different than programmed because of the effect of the charges on the second set of floating gates being coupled with the first. This is known as the Yupin effect.

The above-described Yupin effect is particularly pronounced when the floating gates of the second set of cells programmed subsequently are programmed to a threshold level much higher than that of the floating gates of the first set of cells. From FIG. 4B, it is observed that when the floating gates of the second set of cells are programmed from the erased state E to the highest state C, the Yupin effect is the most pronounced because the change in threshold voltage is relatively large. One approach to reduce the Yupin effect is to program the states to their final value after the succeeding word line has been programmed. This is described in U.S. patent application Ser. No. 10/237,426 filed Sep. 6, 2002 by Raul-Adrian Cernea et al entitled "Techniques for Reducing Effects of Coupling Between Storage Elements of Adjacent Rows of Memory Cells," which is incorporated herein in its entirety by reference. This application introduces the concept of "flag" cells within each page that indicate the programming state of that page (interim or final).

Another approach to reduce the Yupin effect is through the use of an alternative code scheme than the one set forth in FIGS. 4A and 4B as proposed in U.S. Pat. No. 6,657,891 by Shibata et al., which is incorporated herein in its entirety by reference. The code scheme proposed by Shibata et al. is shown in FIGS. 5A–5C. In FIGS. 5A–5C, it is envisioned that there may be more than two logical pages of data that can be represented by the threshold voltage levels of the memory cells, and for this reason, the lower logical page described above is referred to as the first page and upper logical page described above is referred to as the second page in FIGS. 5A–5C. As before, if the first page data to be written into memory cell is "1," programming is not performed and the cell remains in the erased state E. If the first page data is a "0," programming is carried out so that the threshold voltage of the memory cell is raised to one in a distribution or state B' shown in FIG. 5A. This is in contrast to the process in FIG. 4A where a "0" value of the first page data would cause the cell to be programmed to state A. As shown in FIG. 5B, before second-page data is used for programming the cell, data is written to memory cells adjacent to the one already programmed into state B'. As a consequence of the Yupin effect due to the charges on the floating gates of the subsequently programmed adjacent cells, the threshold voltage distribution B' has become wider or larger as shown in FIG. 5B compared to that in FIG. 5A. Note that even the initial distribution B' of FIG. 5A is wider though always lower in value than the final distribution B of FIG. 4A/B or FIG. 5C.

When second page data is written, cells originally in the erased state E are programmed to state A, and those originally in state B' are programmed to state C This code scheme has the effect of reducing the potential differences between charge levels of adjacent cells programmed at different times and, therefore, also the field-effect coupling between adjacent floating gates and hence the Yupin effect.

While the code scheme described above in reference to FIGS. 5A and 5C may be advantageous since it reduces the field-effect coupling within adjacent floating gates, user data may be programmed to the wrong states using such code scheme when there is insufficient user data to fill a page as explained below.

Some non-volatile memory arrays may have 2048 bytes per page. This means that 2048 bytes are read or programmed as a single unit in a read or write operation. System programming of non-volatile memory systems may still treat fewer than 2048 bytes, such as 512 bytes, as a unit. Consequently, each of the first and second (e.g. lower and upper) pages may contain a number of sectors, such as four sectors. In other words, when a host is transferring user data to the memory array, towards the end of the data transfer, there may be insufficient user data to completely program all of the memory cells in the page. Thus, if each page has 2048 bytes, there may only be sufficient data to fill the first page and one, two, or three sectors, but not all four sectors of the second page. This is true where a row of memory cells in the memory array contains interleaved pages (where the even page contains all of the memory cells in the row controlled by the even bit lines and the odd page contains all of the memory cells in the row controlled by the odd bit lines) of the type described above, and where a row of memory cells in the memory array contains a single page. Thus, if each row of 2048 memory cells is divided into two interleaved pages, such as odd and even pages, so that each page contains 1024 bytes, there may only be adequate or sufficient data to fill the even or odd first page and one but not both of the sectors of the even or odd second page. With the type of code scheme illustrated in FIGS. 4A and 4B, this does not create a problem. However, where a different code scheme is used, such as those shown in FIGS. 5A, 5B and 5C described above, this can become a problem as illustrated below.

This issue is illustrated in the example of FIGS. 6A and 6B. In this example, a row in a memory array contains 16,384 memory cells for storing 2048 bytes of data, which constitutes one page. The computer host system transferring data to or from the memory array does so in four blocks each with 512 bytes. Thus, as illustrated in FIG. 6A, the row of memory cells in the array is divided or grouped into four sectors or groups 112, 114, 116 and 118, each of the cells in each group storing a first (lower) and second (upper) page of data. As used hereinafter, the terms "sector" and "group" are used interchangeably. As indicated in FIG. 6A, there is enough host data to fill the first or lower page, so that the four first or lower page sectors are marked "L" to so indicate. Towards the end of the block of user or host data to be programmed, there may only be enough data for programming the lower or first page of the four sectors and only the first sector of the second or upper page of the cells in group 112, which is marked "U" in FIG. 6A to so indicate, so that there is no data left for programming the upper or second pages of cells in sectors or groups 114, 116 and 118 of FIG. 6A, where these are left blank without the marker "U" to so indicate.

Before the user data is used for programming the memory cells in the different groups, the data is first loaded into corresponding data buffers or latches (see FIGS. 7, 8A and 8B). The user data stored in the data latches are then used for programming the memory cells. FIG. 6B is a functional block diagram illustrating the function of the data latches for storing the first and second pages of four blocks of data 112', 114', 116' and 118' for programming the four corresponding sectors or groups 112, 114, 116 and 118 of memory cells of FIG. 6A. After block erase and before the user or host data is loaded into the data latches for programming the cells in the four groups, all of the data latches are loaded with "1" initially. In the example above, the user data is sufficient only for programming the lower or first page of the four groups of memory cells and the upper page of cells in group 112 only. Therefore, as illustrated in FIG. 6B, the upper or second page of the data latches for storing data blocks 114', 116' and 118' have all been loaded with and continue to contain "1.". As shown in FIG. 6B, for example, depending on the user data loaded into the lower or first page in the three blocks of data 114', 116' and 118', some of the memory cells (e.g. those programmed with data 130', 132', 134', 136' and 138') would not be programmed where the data in the data latches in the three sectors has the value "11." However, where the data in the three blocks 114', 116' and 118' has the value "10," (e.g. data 122', 124', 126' and 128') the corresponding memory cells in sectors or groups 114, 116 and 118 would be programmed until the threshold voltages or storage levels correspond to the state "10" according to a code scheme.

Then when another block of user or host data is subsequently loaded to displace the default value "1" in the data latches storing blocks 114', 116' and 118', such data typically would not all be of the value "1," but would contain some values that are "0." Thus, for some of the memory cells (e.g. cells with data 122'–128') in groups 114, 116 and 118 that have been programmed to the state "10," such cells may need to be programmed to the state "00" instead, if the subsequent block of user or host data loads a "0" instead of a "1" as the second or upper page data into the corresponding data latches for such memory cells. From FIG. 5C, it is observed that the state "10" storage level is the highest level C. Since existing programming techniques do not permit the threshold voltage of storage level of individual memory cells to be reduced apart from the block erase operation, it would not be feasible to reprogram such memory cells from the states "10" to the state "00" if the code scheme of FIGS. 5A–5C is used, which results in the cells being programmed to the wrong state. This is referred to herein as the partial page program problem when using the code scheme in FIGS. 5A–5C.

SUMMARY OF THE INVENTION

The inventors recognized that, even though some of the memory cells are programmed to a higher state (e.g. state B) in the first programming pass than the state under conventional code schemes to reduce the Yupin effect, when the non-volatile semiconductor memory system is designed so that the memory cells or charge storage elements are prevented from being programmed to the wrong state (e.g. the highest state) during the second programming pass when there is insufficient host data, the above partial page program problem can be avoided altogether. For example, the elements in such higher state (as a result of the first programming pass) can be programmed during the second programming pass in a manner so that they are in a state at charge, levels still lower than a yet higher erroneous state (e.g. the highest state). In this manner, programming of the memory cells according to subsequent host or user data would not be hampered as a result of the above-described partial page program problem.

In one embodiment, the above result can be achieved by loading appropriate data into the data latches for programming the cells without sufficient upper or second page data after the first programming pass but prior to the second programming pass, so that programming voltages are not coupled to the elements or cells in a higher state (as a result of the first programming pass) when programmed during the second programming. In another embodiment, this can be achieved by slightly altering the code scheme illustrated in FIG. 5C so that the partial page program problem will not occur.

According to another aspect of the invention, flag cells for storing flag data may be used to indicate the boundary of host or user data, such as the end of host or use data, so that the partial program problem does not lead to erroneous results. In one embodiment, the elements are grouped into a plurality of sectors or groups, each group including at least one corresponding flag charge storage cell for storing flag data that indicate whether elements of such group has been programmed or not in the second pass when there is insufficient host data. At least two of the plurality of groups are controlled by a common word line. When there is sufficient host data to program at least one but not all of the at least two groups during the second pass, flag data is stored in at least one of the flag charge storage cell(s) in the at least two groups, or the flag data stored in such flag cell(s) is altered, to indicate a boundary of the host data.

BRIEF DESCRIPTION OF THE DRAWINGS

FIGS. 1A–1E illustrate schematically different examples of non-volatile memory cells.

FIG. 2 illustrates an example of an NOR array of memory cells.

FIG. 3 illustrates an example of a NAND array of memory cells, such as that shown in FIG. 1D.

FIGS. 4A and 4B are voltage threshold level distributions that illustrate an existing technique for programming the memory cell array of FIG. 3.

FIGS. 5A–5C are voltage threshold level distributions that illustrate another existing technique for programming the memory cell array of FIG. 3.

FIG. 6A is a schematic diagram of a row of memory cells useful for illustrating the partial page program problem.

FIG. 6B is a conceptual diagram of four blocks of data for programming the memory cells in FIG. 6A useful for illustrating the partial page program problem.

FIG. 7 is a schematic block diagram of an individual read/write module partitioned into a core portion and a common portion to illustrate one embodiment of the present invention.

FIG. 8A illustrates schematically a compact memory device having a bank of partitioned read/write stacks, useful for illustrating one embodiment of the present invention.

FIG. 8B illustrates another arrangement of the compact memory device shown in FIG. 7.

FIG. 9 is a schematic block diagram of the components of the read/write module of FIG. 7 showing in more detail its operation to illustrate one embodiment of the invention.

FIGS. 10A and 10B are graphical illustrations of voltage threshold level distributions and a technique for reading the voltage threshold levels of memory cells to illustrate one embodiment of the invention.

FIGS. 11A and 11B are tables setting forth the reading of the first and second (lower and upper) pages useful for illustrating a method of reading the voltage threshold levels illustrated in FIGS. 10A and 10B.

FIG. 12 is a graphical illustration of the voltage threshold level distributions and the associated values of a code scheme to illustrate an alternative embodiment of the invention.

For simplicity and description, identical components are labeled by the same numerals in this application.

DESCRIPTION OF EXEMPLARY EMBODIMENTS

Example Non-Volatile Memory System:

FIG. 7 is a schematic block diagram of an individual read/write module 200 partitioned into a core portion 210 and a common portion 220, according to a preferred embodiment of the present invention. The core portion 210 comprises a sense amplifier 212 that determines whether a conduction current in a connected bit line 211 is above or below a predetermined threshold level. As described above, the connected bit line 211 enables access to the drain of an addressed memory cell in an array.

In one embodiment, the core portion 210 also includes a bit line latch 214. The bit line latch is used to set a voltage condition on the connected bit line 211. In one implementation, a predetermined state latched in the bit line latch will result in the connected bit line 211 being pulled to a state designating program inhibit (e.g., Vdd). This feature is used for program inhibition as will be described below.

The common portion 220 comprises a processor 222, a set of data latches 224 and an I/O Interface 226 coupled between the set of data latches 224 and a data bus 231. The processor 222 performs computations. For example, one of its functions is to determine the memory state of the sensed memory cell and stores the determined data into the set of data latches. As explained in the background section, a memory cell can hold a range of charge and therefore can be programmed to any threshold voltage level (i.e., the control gate voltage that just turns on the cell to a predetermined conduction current) within a threshold voltage window. The set of data latches 224 is used to store data bits determined by the processor from the current sensed by the sense amplifier during a read operation. It is also used to store user data bits imported from the data bus 231 from a host (not shown) during a program operation. The imported data bits represent write data meant to be programmed into the memory. The I/O interface 226 provides an interface between the set of data latches 224 and the data bus 231.

During read or sensing, the operation is under the control of a state machine (not shown) that basically controls the supply of different control gate voltages to the addressed cell, directs the processor to appropriately load the various data latches, and energizes the sense amplifier. As it steps through the various predefined control gate voltages corresponding to the various memory states supported by the memory, the sense amplifier 212 will trip at one of these voltages. At that point the processor 222 determines the resultant memory state by consideration of the tripping event of the sense amplifier and the information about the applied control gate voltage from the state machine via an input line 223. It then computes a binary encoding for the memory state and stored the resultant data bits into the set of data latches 224. The state machine communicates with all of the circuit blocks in module 200.

The SA/bit line latch 214 can also serve double duty both as a latch for latching the output of the sense amplifier 212, and also as a bit line latch as described in connection with FIG. 7. Thus, it can either be set by the sense amplifier or by the processor. In a preferred implementation, the signal from the SA/bit line latch 214 is driven by a driver (not shown) to set the voltage of the selected bit line 211.

Referring to FIG. 7, during program or verify, the data to be programmed is inputted into the set of data latches 224 from the data bus 231. The program operation, under the control of the state machine comprises a series of programming voltage pulses applied to the control gate of the addressed cell. Each programming pulse is followed by a read back to determine if the cell has been programmed to the desired memory state. The processor 222 monitors the read back memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate.

The I/O interface 226 enables data to be transported in or out of the set of data latches 224. As will be seen in FIGS. 8A and 8B, a block of read/write modules are used in parallel on a memory device to read or program a block of data at a time. Typically, the block of read/write modules has its individual sets of data latches combined to form a shift register so that the data latched by the block of read/write modules can be transferred out serially to the data bus 231. Similarly, program data for the block of read/write modules can be serially input from the data bus 231 and latched into the respective set of data latches.

Compact Read/Write Circuits

One notable feature of the present architecture, for a block of read/write modules operating in parallel, is the partitioning of each module into a core portion and a common portion, and having the block of core portions operating and sharing with substantially lesser number of common portions. This architecture allows duplicative circuits among the individual read/write modules to be factored out, thereby saving space and power. In high density memory chip designs, the saving in space can be as much as fifty percent of the entire read/write circuits for the memory array. This allows the read/write modules to be densely packed so that they can simultaneously serve a contiguous row of memory cells of the memory array, so that all of the cells in the row can be programmed or read at the same time.

FIG. 8A illustrates schematically a compact memory device having a bank of partitioned read/write stacks, according to one embodiment of the present invention. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block of memory cells to be read or programmed in parallel. In one embodiment, where a row of memory cells are partitioned into multiple blocks, a block multiplexer 350 is provided to multiplex the read/write circuits 370 to the individual blocks. Communication among a read/write stack 400 is effected by a stack bus and controlled by a stack bus controller 430.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

FIG. 8B illustrates a preferred arrangement of the compact memory device shown in FIG. 8A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Each partitioned read/write stack 400 in FIG. 8A or 8B essentially contains a stack of read/write modules servicing a segment of k memory cells in parallel. Each stack is partitioned into a core stack portion and a common stack portion in the manner shown in FIG. 7. Communication among each read/write stack 400 is effected by an interconnecting stack bus (not shown) and controlled by the stack bus controller 430. Control lines (not shown) provide control and clock signals from the stack bus controller 430 to each of the core portion of the read/write stacks. Similarly, control lines (not shown) provide control and clock signals from the stack bus controller 430 to each of the common portion of the read/write stacks 400.

The entire bank of partitioned read/write stacks 400 operating in parallel allows a block of p cells along a row to be read or programmed in parallel. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

In the embodiment shown in FIG. 8A, there will be p number of read/write modules, one for each of the p cells. As each stack is serving k memory cells, the total number of read/write stacks in the bank is therefore given by r=p/k. In the example where p=512 bytes and k=8, r will be 512.

As mentioned above, one problem encountered in high density and high performance memory is the need for reading and programming a block of contiguous row of cells in parallel and the difficulty in accommodating a read/write module for every cell.

The accommodation problem is alleviated by a preferred embodiment shown in FIG. 8B in which the peripheral circuits are formed on opposite sides of the memory array. When the read/write circuits 370A, 370B are formed on opposite sides of the memory array 300, half of the block of p cells will then be accessed from the top and the other half from the bottom side of the array. Thus, there will be p/2 number of read/write modules on each side. It follows that the read/write stacks 400 on each side will need only serve p/2 number of bit lines or memory cells in parallel, thus the total number of read/write stacks in the bank is given by r=p/2k. In the example where p=512 bytes and k=8, r will be 256. This means that only half as many read/write stacks 400 are required on each side of the memory array compared to the embodiment shown in FIG. 8A.

In other embodiments, where accommodation or other considerations dictate even lower density, a row of cells is partitioned into two or more interleaving blocks of cells. For example, one block of cells consists of cells from even columns and the other block of cells from odd columns. As shown in FIGS. 8A and 8B, the block multiplexer 350 or 350A and 350B will be used to switch the bank of partitioned read/write stacks to either the even or odd block. In the embodiment shown in FIG. 8B, there will be p/4 number of read/write modules on each side of the array. In this case, the number of read/write stacks on each of the opposite sides will be r=p/4k. Thus, more room is provided to fit the fewer read/write modules, but at the expense of reduced performance and that the read/write block is no longer contiguous.

Embodiments for Solving the Partial Program Problem

As described above, the partial program problem occurs when a memory cell is programmed using a code scheme, such as the one in FIGS. 5A–5C and 10A, 10B to state B, and there is insufficient user or host data for programming the cell during the second programming pass. Since the second (upper) page data in the data latch in such event would be the default "1" value, such cell would be programmed to state C under the code scheme in FIGS. 5A–5C, 10A, 10B, unless this is prevented from happening as described below. When subsequent user or host data in the next program operation requires that such cells remain in or be programmed to state B, this cannot be done since most designs do not permit the lowering of the cell threshold level except in block erase operations.

One embodiment of the invention is based on the recognition that, for memory cells without user or host upper page data, after the first programming pass but prior to the second programming pass in a programming operation, the lower page data in the data latches used for programming such memory cells is displaced by appropriate substitute data to prevent the programming of such memory cells in a second programming pass. Thus, in one implementation of this embodiment, where the erased or reset state E represents or corresponds to the data "11," the first or lower page data in the data latches read from such memory cells in an internal data load operation is displaced by "1." This is illustrated in more detail in reference to FIG. 9 below.

FIG. 9 is a schematic block diagram showing in more detail the construction of data latches in the circuit blocks in FIG. 7. As shown in FIG. 9, the data latches 224 in FIG. 7 include at least three latches 224a, 224b and 224c. In one of the examples above, the module 200 in a read/write stack 400 is used for controlling the reading and writing of a corresponding memory cell amongst the k cells served by the stack. Therefore, the latches 224a–224c may each be a 1-bit latch. During a programming operation, user or host data is loaded into the latches through data bus 231 and I/O interface 226. In one embodiment, a first or lower data bit is first loaded through bus 231 and interface 226 into latch 224a. This is performed by all of the read/write modules 200 in each of the stacks 400 in the bank of stacks of FIGS. 7, 8A, 8B in parallel for programming an entire page. The entire page may consist of all of the memory cells in one row in the memory array 300. Alternatively, the entire page may consist only of the memory cells in a portion of a row in the memory array 300, such as the odd or even pages in the case of interleaved pages in a row of cells.

The memory cells in the page are then programmed using the lower or first page data in the data latches 224a in all of the modules 200 in the bank of stacks 400. After the memory cells in a page have been programmed using the first or lower page data in the latches 224a, second or upper page data is loaded through bus 231 and interface 226 into latch 224a, which data is shifted by processor 222 to latch 224c, in preparation for the second pass programming of the memory cells. As noted above, for second pass programming, it is necessary to know the threshold voltages or threshold levels of the memory cells after the first programming pass prior to second pass programming. In one embodiment, this is performed by an internal data load operation where the currents in the memory cells in the page are sensed by means of sense amplifiers 212 in the modules 200 in the bank of stacks 400. The threshold voltages or storage levels of such cells and data corresponding to such are then determined by processor 222 in the modules and stored in latches 224a in the modules. Where there is sufficient upper or second page data for programming the page in a second pass programming, the data stored in latch 224a and user or host upper or second page data in latch 224c are used for programming the memory cells in the page in the second pass programming. This is the case for programming the cells in sector 112 of FIG. 6A in the example below.

However, where there is insufficient upper or second page data for programming the entire page, this is first detected by control circuitry 310. In the example illustrated in FIGS. 6A and 6B, while there is sufficient data to program the first or lower page of the memory cells, there is only enough data for the first sector 112. Thus, the host or user data ends with such sector, and there is no more upper or second page data for the sectors 114, 116 and 118. In such event, and in one embodiment of the invention, the state machine 312 then causes substitute data to be loaded into latch 224*a* for displacing the data that results from the internal data load operation from reading the memory cells. The displacement of the internally loaded lower or first page data by means of substitute data occurs only for the data latches of the modules controlling the programming of memory cells for which there is insufficient upper or second page data. In the example of FIGS. 6A and 6B, this occurs only for the memory cells in sectors 114, 116 and 118. For the data latches 224*a* in modules for controlling the programming of the memory cells in sector 112, the data in latches 224*a* continues to be that which results from the internal data load operation described above. Thus, by keeping track of the boundaries between the data blocks 112', 114', 116' and 118', and which one(s) of these sectors are with or without user or host data, the loading of substitute data to replace those read in internal data load is performed only for the cells in sectors of the page that do not have second or upper page data. In one embodiment, the page boundary is monitored by the controller circuitry 310 for controlling the programming of the memory cells. As described in more detail below, the controller circuit or circuitry 310 stores appropriate flag data or appropriately alters flag data in the flag charge storage cell(s) of the corresponding sectors to indicate the sectors in the row for which there is insufficient host data.

In the embodiment above, substitute data is used to replace the data loaded into latches 224*a* in the different modules when there is insufficient second or upper page data for programming the corresponding cells. It is noted, however, that the partial page program problem occurs only for cells that have been programmed to the B' state during the first programming pass. For cells that remain in the erased state E after the first programming pass, they can be programmed correctly to state A or remain correctly in state E as a result of the second programming pass. Therefore, in the embodiment above, it is necessary to load substitute data "1" into only the latches 224*a* for programming cells that are in state B', and not for those in state E after the first programming pass. This has the effect of preventing the coupling of programming voltages to the cells in state B' during the second pass. This also has the effect of inhibiting further movement of the B' distribution into the B distribution, so that when subsequent upper page data does become available for each of sectors 114, 116, and 118, each sector will begin programming from either state E or B'. For such cells, or as another alternative for all cells without corresponding second or upper page data, the internal load operation can also be replaced by the operation of loading "1" into the data latches for programming these cells. Such and other variations are within the scope of the invention. This embodiment is also not limited to the scheme where the erased state E represents data "11."

In a manner similar to that described above in connection with FIGS. 5A and 5B, in the embodiment above, even though the B' distribution of cells without second or upper page data may have been broadened due to the Yupin effect when adjacent cells are subsequently programmed, the charge levels in such broadened B' states are still below those of the next higher state C.

The above-described loading of data into latch 224*a* to displace the data that results from the internal data load by reading the memory cells may be performed in a manner transparent to the user or host by the control circuitry 310, including the state machine 312. Alternatively, such operation can be achieved by changing the program sequence. Instead of adding a new command in the program algorithm, zone detection circuits may also be used to detect which zones or sectors are being programmed by the user or host, and select the rest of the sector(s) or zone(s) to fill in the data "11" in both latches 224*a* and 224*c* in a global reset. All such variations are within the scope of the invention.

Read Operation

When a page that has been partially programmed is read at a page boundary, the read algorithm may also need to be modified since the read level of memory cells that have been completely programmed may be different from the read level of memory cells that have not been completely programmed. This is illustrated in FIGS. 10A and 10B. FIG. 10A is a graphical illustration of the threshold voltage level distributions of memory cells in group or sector 112 of the row of memory cells in the memory array illustrated in FIG. 6A in the example described above. In such example, all of the memory cells in group or sector 112 have been programmed during the first and second programming passes, so that the threshold voltages of these cells have the distributions E, A, B, C in FIGS. 5C and 10A. For the memory cells in sectors 114, 116 and 118, however, these memory cells are either in state E or B' in FIG. 5A, 5B or 10B. To obtain the upper or second page data represented by the threshold voltages of the cells in all four sectors 112, 114, 116 and 118, the memory cells are read at two different read levels: Va and Vc and voltage sense mode will be assumed. In order to obtain the code scheme for the upper or second page of "1001" indicated in FIGS. 5C and 10A, the convention when the read level Va is employed is different from (and actually opposite to) that used when the read level Vc is used. Thus, in reference to FIG. 11A, when the read level Va is used, if the cell's threshold voltage is below (or more negative) than Va, the upper page value corresponding to such threshold voltage is a "1," For the read level Vc, however, the opposite is the case. Thus, for the read level Vc, if the threshold voltage of a memory cell is above Vc, such threshold voltage corresponds to an upper or second page value of "1", but if the threshold is below Vc such threshold voltage corresponds to an upper or second page value of "0." When such convention is used the upper or second page values that correspond to the states E, A, B, C are shown in FIG. 11A. When the two values resulting from the two readings with the read levels Va and Vc, are combined in an logical OR operation, the combination yields the code scheme "1001" for the second or upper page, illustrated in FIGS. 5C and 10A. Thus, the combination of the two values resulting from the two reads for states E and C results in an upper or second page value of "1", while the combination of the two readings resulting from states A and B results in an upper or second page value of "0."

The same convention as that described above for reading the memory cells in group or sector 112 is also applied for reading the partially programmed memory cells in groups or sectors 114, 116 and 118 so that a common algorithm can be used for simultaneously reading all cells along the selected word line. The readings are then combined in a similar manner in a logical OR operation to give values for the upper or second page as illustrated in FIG. 11A. Such upper or second page values are then stored in latch 224*c*, shifted to latch 224*a* and to bus 231 through I/O interface 226 by means of the processor 222 in FIG. 9. From the above, it is observed that the same set of read levels (Va and Vc) may be used for reading the upper or second page value of all the memory cells, whether they have been completely programmed or only partially programmed.

When the lower or first page value is read, however, the result will be different depending on whether all the memory cells in a page have been completely programmed or not. Thus, for the memory cells in group or sector 112, all of the cells have been programmed to states E, A, B and C as shown in FIG. 10A, so that the read level to be applied is Vb. The memory cells in groups or sectors 114, 116 and 118 have only been programmed in the first programming pass and not in the second programming pass so that their threshold voltage distributions will be as shown in FIGS. 5A, 5B or 10B. As described above in reference to FIG. 5B, the distribution B' in FIGS. 5B and 10B has broadened due to the Yupin effect. When lower or first page data is to be read from the cells in groups or sectors 114, 116 and 118, the read level should be Va instead of Vb.

In one embodiment, the memory cells in all sectors 112, 114, 116 and 118 are all read sequentially with read level Vb and then read with read level Va, with the results illustrated in FIG. 11B. The convention used in both reads is such that if the threshold voltage is below Vb the lower or first page bit value is a "1," and if the threshold voltage is above Vb the lower or first page bit value is a "0." As will be observed from FIG. 11B, when a memory cell in group or sector 112 is read, only the reading using the read level Vb will be valid and when a memory cell in any one of the groups or sectors 114, 116 and 118 is read, only the reading using the read level Va is valid. In one embodiment, to facilitate the two reading operations using two different read levels, the lower or first page value resulting from a reading operation using the read voltage Vb, is stored in latch 224c and the lower or first page value obtained using the read level Va is stored in latch 224b. Then, depending upon whether the memory cell that is being read has been completely programmed or only partially programmed, the value in one of the two latches 224b and 224c is shifted to latch 224a and sent to the data bus 231 through interface 226 as the lower or first page value read from such cell.

In order to be able to distinguish between cells that have been completely programmed from those that have been only partially programmed, flag charge storage cells are used. As disclosed in earlier referenced application Ser. No. 10/237,426 and U.S. Pat. No. 6,657,891 to Shibata et al., flag cells are incorporated in the row of memory cells in the memory array and these cells are read together with the memory cells in read operations. Thus, employing the same architecture as that described in U.S. Pat. No. 6,657,891 (e.g. described in relation to FIG. 3), corresponding flag charge storage cells may also be incorporated in each of at least some of the rows in memory array 300. Each of the sectors contains at least one corresponding flag charge storage cell. The locations of the corresponding flag cells in the sectors 112, 114, 116 and 118 are indicated by arrows FC in FIG. 6A. As described in one implementation in the Shibata patent, during the first programming pass, the first or lower page bit of the flag cells remains a "1" and is not changed to a "0." During the second programming pass for programming the second page, the second or upper page bit of the flag cells is changed from a "1" to a "0" to indicate that the second programming pass has been performed. As described above, during the second programming pass, the memory cell is read to obtain the lower page bit value in that internal data load process. Preferably, during this internal data load process, the lower or first flag bit is also changed from "1" to "0.". Therefore, after the second programming pass has been completed, both the upper and lower (second and first) flag bits of the flag cells have been changed from "11" to "00." In one embodiment, the changing of the bit values of the first and second (lower and upper) pages may be performed by control circuitry 310; alternatively the appropriate bit values may be stored in the flag cell(s) by control circuitry 310.

The values of the flag data can also be used to mark a boundary of the host or user data, such as the end of the host or user data. In the example above, the flag data in the flag cell(s) of the sector or group that have been programmed during the second pass would have the values "00," whereas the flag data in the flag cell(s) of the sector or group that have not been programmed during the second pass would have the values "11." A boundary of the host or user data stored in the charge storage elements in two adjacent sectors or groups is then indicated when the bit values of the flag cell(s) of the two adjacent sectors or groups change between "11" and "00." The end of the host or user data may be indicated at the juncture between two adjacent sectors or groups (such as two among a plurality of sectors or groups controlled by a common word line) whose flag data change from "11" to "00" across the juncture. By keeping track of the values of the flag data, it is possible to prevent erroneous results, such as from reading the charge storage elements as explained below.

In a read operation, the read level depends upon whether a memory cell to be read has been completely programmed or only partially programmed. This can be ascertained by reading the flag bits embedded within the row of memory cells that is to be read. As noted above, during the internal data load process of the second programming pass, the lower or first flag bit is also changed from "1" to "0." Hence, when this lower or first flag bit is read, the correct read level can be determined: if this bit is a "1," the read level is Va, but if this bit is a "0," the read level is Vb. This is true also for reading memory cells in most of the rows in memory array 300 where all the memory cells have been completely programmed, except at the page boundary where a page has only been partially programmed. Therefore, by setting each of the two flag bits to "0," the lower or first page read of the memory cells in a page can be completed together with a reading of the first or lower flag bit for the page with read level Vb. Therefore, in most instances where the entire page has been completely programmed, the flag bits can be sensed and the state machine adjusted so that there will be no need for a second read operation with the read level Va. Hence depending on the result of reading the flag data, a different sequence of read levels may be applied for reading the lower or first page value from the cells. Where the flag data indicates that all of the cells in a page have been completely programmed, then only one read operation with read level Vb will suffice whereas where the flag data indicates that not all of the cells in a page have been completely programmed, then two read operations with read level Vb followed by read level Va will be needed. Thus, different read sequences are available, and the appropriate sequence is selected for use depending on the value of the flag data that is read.

From the above, it will be evident that more time will be needed for reading a partially programmed page, since the lower or first page data is read sequentially at two different read levels for the sectors in the page that have not been completely programmed. For this purpose, the state machine 312 in control circuitry 310 in FIGS. 8A and 8B sends a busy signal through a ready/busy signal line (not shown separately) in bus 301 to the host controller when it is determined that there is insufficient data to fill a page. This state machine then adjusts its timing signals to allow more time for the read operation of the memory cells that have not been completely programmed. Control circuitry 310 in turn notifies the host controller to let the user know that there will be more latency in reading the data from the flash memory.

Where the threshold voltages or storage levels are read with cache timing using dummy time period, when change of the flag bits from "11" to "00" is detected, the state machine in control circuitry 310 would increase the length of dummy time periods for reading the storage levels of the threshold voltages to allow more time for reading sequentially at two different read levels.

FIG. 12 is a graphical illustration of the threshold voltage distributions and the data they represent according to a novel alternative code scheme to illustrate an alternative embodiment of the invention. A comparison of FIGS. 10A and 12 will reveal that the two code schemes differ in that, in the new code scheme in FIG. 12, the threshold voltage distribution B represents "10" and the threshold voltage distribution C represents "00." In the code scheme in FIG. 10A, however, the distribution B represents "00" and distribution C represents "10." A comparison of FIGS. 10A and 12 also reveal that the four different distributions E, A, B, C in both code schemes have the same lower or first page values "1100.". Using the new code scheme in FIG. 12, during the first programming pass, memory cells are either not programmed so that they remain at state E when the host data is "1," or is programmed to distribution B' if the host data is "0." During the second programming pass, if the upper or second page bit value is "1," the memory cell is not programmed so that it remains at distribution E or is tightened to distribution B. If the user data is a "0," then the memory cell is programmed to distribution A or C, depending upon the initial distribution of the memory cell after the first programming pass. Thus, the new code scheme of FIG. 12 also reduces the Yupin effect in a manner analogous to that of the code scheme in FIGS. 5C and 10A.

From FIG. 12, it will be evident that the upper or second page value for states E and B at the first programming pass are both "1." This means that where there is insufficient host or user data to fill an entire page, when the user data in the data latches is used to program the memory cells in a second programming pass, the memory cells for which there is insufficient upper or second page data will not be programmed to an erroneous distribution. This is true whether the cell is in state E or state B', unlike the situation using the code scheme in FIGS. 5C and 10A. Referring again to the example in FIG. 6B, when the host data has the data "0" for the first or lower page, but no data for the second or upper page for the location 122', the default value for the second or upper page for the location is a "1" so that location 122' would be filled with the value "10." This value requires programming to distribution C according to the code scheme in FIG. 10A, but to distribution B according to the code scheme in FIG. 12. Since the lower or first page value of host data is a "0," the corresponding memory cell in sector 114 has already been programmed to state B' in the first programming pass and only needs to be moved slightly to state B. Note that in contrast to the previous embodiment in which the individual sectors 114, 116, or 118 remain in state E or B', in this embodiment as soon as the first sector 112 is programmed with upper page data, all other cells in that page that were previously in state B' are moved to state B. Therefore, when fresh host data becomes again available for programming the second or upper page of memory cells in sectors 114, 116 and 118 of the page, the memory cells in these sectors are already at the correct threshold voltage distributions.

It is observed that using the code scheme illustrated in FIG. 12, the partial page program described above will not occur. The partial page program problem can be solved using code schemes that are different from that of FIG. 12 in the same vein, if the two possible storage levels for cells after the first programming pass are represented by the same value for the second or upper page. Where the two possible states are the erased (or reset) and B states in FIGS. 5C and 10A, the second page values for both states are preferably the same. The partial page program problem will then not occur.

Since the partial page program problem does not occur with the code scheme in FIG. 12, there is no need to have distinct flag storage cells for each sector of the page. It is also noted from FIG. 12 that both the upper and lower (first and second) page bit values change between distributions A and B in the code scheme in FIG. 12, so that the code scheme is not a Gray code. This means that if the distribution drifts from B to A (for example, through various kinds of disturb mechanism well know in the art), bit errors will be found in two pages of logical data, and more error correction (ECC) bits may be desirable when the using this code scheme. Furthermore, to obtain the upper or second page value information from the memory cells, it may be necessary to read at three different read levels so that the reading time is longer compared to that employing the code scheme of FIG. 10A. The code scheme of FIG. 12, however, is advantageous in that it does not require extra data latches such as data latch 224b in FIG. 9.

One possible alternative to the above designs is to enable the four groups 112, 114, 116 and 118 in FIG. 6A of cells to be controlled by read/write modules that are separately controlled. This would provide more flexibility in solving the partial page program problem, but would increase the die size of the memory device. One advantage of both the schemes of FIG. 10 and FIG. 12 is that the read/write modules may be controlled in a simpler manner, so that the die size will not be increased, or be increased by small amounts.

While the invention has been described above by reference to various embodiments, it will be understood that changes and modifications may be made without departing from the scope of the invention, which is to be defined only by the appended claims and their equivalent. For example, while the embodiments are described by reference to operations on NAND arrays, they are applicable to NOR arrays as well; such and other variations are within the scope of the invention. While the invention is illustrated by reference to rows of memory cells each grouped into four sectors, the rows may be grouped into a larger or fewer number of sectors, and the same advantages described herein are available for such different grouping schemes. All references referred to herein are incorporated by reference.

What is claimed is:

1. A method for programming non-volatile memory cells of a type that store data as corresponding different levels of charge in charge storage elements thereof, the charge storage levels of said elements being in a reset charge storage level distribution prior to the programming, said method comprising:

programming the charge storage elements in at least two passes, wherein during a first pass, selected ones of the elements are programmed into a first storage level distribution, and during a subsequent second pass, selected ones of the elements in the reset charge storage level distribution are programmed into a second storage level distribution and selected ones of the elements in the first storage level distribution are programmed into a third storage level distribution, the second storage level distribution being between the reset and the first storage level distributions, the first storage level distribution being between the second and third storage level distributions, the first storage level distribution being between the second and third storage level distributions;

wherein when there is insufficient host data to program at least one of the elements during the second pass, said at least one element having been programmed into the first storage level during the first pass, the programming is such that it causes the charge storage level of said at least one element to be below the charge storage levels of the third storage level distribution after the second pass.

2. The method of claim 1, wherein the programming includes loading host data into a data buffer, and coupling voltages to the elements according to the data in the data buffer to program the elements to selected storage levels, said programming further including loading data into the data buffer after the first pass so that among the elements, those without corresponding host data in the data buffer are not programmed during the second pass.

3. The method of claim 2, wherein the data loaded into the data buffer after the first pass is not from a host.

4. The method of claim 2, wherein the data loaded into the data buffer after the first pass corresponds to the reset charge storage level distribution.

5. The method of claim 2, wherein the data loaded into the data buffer after the first pass causes programming of the elements without corresponding data in the data buffer to be inhibited during the second pass.

6. The method of claim 2, wherein the voltage levels of the elements without corresponding host data in the data buffer and the voltage levels of the elements with corresponding host data in the data buffer are programmed by means of sensing circuits that are not individually controlled.

7. The method of claim 2, wherein the elements are grouped into a plurality of groups, and each of a plurality of flag charge storage cells is used to store flag data that indicates whether or not the elements of a corresponding group in the plurality of groups have been programmed in the second pass, said method further comprising:

reading storage levels stored in the plurality of groups of elements, wherein the storage level stored in each of at least some of the elements in one of the groups is read by coupling different read voltages to such element to obtain a plurality of readings;

storing the plurality of readings in storage devices; and selecting only one of the plurality of readings to represent host data stored in each of the at least some elements according to the flag data stored in the flag charge storage cell(s) corresponding to said one of the groups.

8. The method of claim 2, wherein the elements are grouped into a plurality of groups, each group including at least one flag charge storage cell for storing flag data that indicates whether elements of such group have been programmed or not in the second pass, the elements in at least two of the plurality of groups controlled by a common word line, wherein the reading reads the flag data stored in the flag charge storage cells, so that when the flag data indicate that the elements in a first one of the at least two groups have been programmed in the second pass and the elements in a second one of the at least two groups have not been programmed in the second pass, the reading reads storage levels stored in the first and second groups of elements by coupling different sequences of read voltages to the elements in the first and second groups.

9. The method of claim 8, wherein data represented by storage levels of each of the elements in the first and second groups comprises an ordered set of at least a first and a second variable of binary values, said ordered sets also used for programming the elements wherein the storage level(s) to which the elements are to be programmed during the first pass is determined according to at least a value of the first variable, and the storage level(s) to which the elements are to be programmed during the second pass is determined according to at least a value of the second variable, and wherein the reading couples only one read voltage to elements in the first group to provide values of the first variable represented by the storage levels, and couples two different read voltages to elements in the second group to provide values of the first variable represented by the storage levels.

10. The method of claim 8, wherein the reading reads the flag data stored in the flag charge storage cells corresponding to the at least two groups, so that when the flag data indicate that some but not all of the elements controlled by the common word line have been programmed in the second pass, more time is allotted for the reading of elements that have not been programmed in the second pass.

11. The method of claim 10, wherein the flag charge storage cells are located along the word line to indicate whether the at least two of the plurality of groups of elements along the word line have been programmed during the second pass, and when the flag data indicate that one or more of the groups controlled by the word line have not been programmed during the second pass, a busy signal is generated in a manner to indicate to a user to expect more latency when elements that have not been programmed in the second pass are to be read.

12. The method of claim 2, wherein data represented by storage levels of each of the elements comprises an ordered set of at least a first and a second variable of binary values, said ordered sets also used for programming the elements wherein the storage level(s) to which the elements are to be programmed during the first pass is determined according to at least a value of the first variable, and the storage level(s) to which the elements are to be programmed during the second pass is determined according to at least a value of the second variable, said method further comprising:

reading storage levels of the elements by coupling different read voltages to such elements to provide values of the second variable represented by the storage levels, wherein for a first read voltage, a first value of the second variable indicates that current in such element during the reading is lower than a threshold and a second value of the second variable indicates that current in such element during the reading is higher than the threshold, and for a second read voltage, the first value of the second variable indicates that current in such element during the reading is higher than the threshold and the second value of the second variable indicates that current in such element during the reading is lower than the threshold.

13. The method of claim 12, wherein the first read voltage is between the reset level and the second storage level, and the second read voltage is between the first and third storage levels.

14. The method of claim 2, wherein the elements are grouped into a plurality of groups, and each of a plurality of flag charge storage cells is used to store flag data that indicates whether the elements of a corresponding group in the plurality of groups have been programmed in the second pass, said method further comprising:

reading storage levels stored in the plurality of groups of elements with cache timing, said cache timing including dummy time periods, wherein the dummy time period(s) for reading the storage levels stored in the elements in one of the groups that have not been programmed in the second pass are longer than the dummy time period(s) for reading the storage levels stored in the elements in another one of the groups that have been programmed in the second pass.

15. The method of claim 2, wherein the elements are grouped into a plurality of groups, each group including at least one flag charge storage cell for storing flag data that indicates whether elements of such group have been programmed or not in the second pass, at least two of the plurality of groups controlled by a common word line, said method further comprising:

when there is sufficient host data to program at least one but not all of the at least two groups during the second pass, storing or altering flag data in at least one of the flag charge storage cells in the at least two groups to indicate a boundary of the host data.

16. The method of claim 15, wherein two groups that are among the at least two groups are located adjacent to each other, wherein the elements in a first one of the two adjacent groups have been programmed in the second pass and the elements in the second one of the two adjacent groups have not been programmed in the second pass, and wherein said storing stores flag data in at least one of the flag cells of the two adjacent groups such that the flag data stored in the flag cell(s) of the first group are different from the flag data stored in the flag cell(s) of the second group to indicate that host data boundary is located between the two adjacent groups.

17. The method of claim 1, wherein the programming includes loading host data into a data buffer, and coupling voltages to the elements according to the data in the data buffer to program the elements to selected storage level distributions according to a code scheme, said code scheme being such that among the elements, programming voltages are not coupled to those elements without corresponding host data in the data buffer during the second pass.

18. The method of claim 17, wherein the code scheme is not a grey Gray code.

19. The method of claim 17, wherein data represented by storage levels of each of the elements comprises an ordered set of at least a first and a second variable of binary values, said ordered sets also used for programming the elements wherein the storage level(s) to which the elements are to be programmed during the first pass is determined according to at least a value of the first variable, and the storage level(s) to which the elements are to be programmed during the second pass is determined according to at least a value of the second variable, and wherein the code scheme is such that values of the second variable representing the reset and first storage levels are the same.

20. The method of claim 19, further comprising reading storage levels stored in the elements by sequentially coupling three different read voltages to such element to obtain a value for the second variable.

21. The method of claim 1, wherein the programming includes loading host data into a data buffer, and coupling voltages to the elements according to the data in the data buffer to program the elements to selected storage levels according to a code scheme, said code scheme being such that among the elements, charge storage levels of the elements without corresponding host data in the data buffer are below the charge storage levels of the third storage level distribution after the second pass.

22. The method of claim 21, wherein the programming of elements in the vicinity of the elements without corresponding host data in the data buffer causes the charge storage levels of the elements without corresponding host data in the data buffer to have a distribution that is different from the first storage level distribution as a result of field effect coupling.

23. The method of claim 21, wherein the code scheme is not a Gray code.

24. The method of claim 21, wherein data represented by storage levels of each of the elements comprises an ordered set of at least a first and a second variable of binary values, said ordered sets also used for programming the elements wherein the storage level(s) to which the elements are to be programmed during the first pass is determined according to at least a value of the first variable, and the storage level(s) to which the elements are to be programmed during the second pass is determined according to at least a value of the second variable, and wherein the code scheme is such that values of the second variable representing the reset and first storage levels are the same.

25. The method of claim 24, further comprising reading storage levels stored in the elements by sequentially coupling three different read voltages to such element to obtain a value for the second variable.

* * * * *